United States Patent [19]

Ellerson et al.

[11] Patent Number: 5,252,179

[45] Date of Patent: Oct. 12, 1993

[54] APPARATUS AND METHOD FOR SELECTIVELY ETCHING A PLASTIC ENCAPSULATING MATERIAL

[75] Inventors: James V. Ellerson, Endicott; Louis J. Konrad, III, Endwell; Ronald J. Moore, Binghamton; Jack A. Varcoe, Endwell, all of N.Y.

[73] Assignee: International Business Machines Corporation, Armonk, N.Y.

[21] Appl. No.: 951,614

[22] Filed: Sep. 28, 1992

[51] Int. Cl.⁵ .......................... B44C 1/22; B29C 37/00
[52] U.S. Cl. .................... 156/655; 156/668; 156/345
[58] Field of Search ............. 156/640, 655, 668, 345; 252/79.2, 79.4; 134/3, 28, 32, 151, 198

[56] References Cited

U.S. PATENT DOCUMENTS

| | | | |
|---|---|---|---|
| 3,969,813 | 7/1976 | Minetti et al. | 156/344 X |
| 4,359,360 | 12/1982 | Harris et al. | 156/345 |
| 4,366,925 | 1/1983 | Fanene | 228/20 |
| 4,384,917 | 5/1983 | Wensink | 156/627 |
| 4,392,617 | 7/1983 | Bakos et al. | 239/290 |
| 4,826,556 | 5/1989 | Kobayashi | 156/345 |

FOREIGN PATENT DOCUMENTS 63-184347 7/1988 Japan .

OTHER PUBLICATIONS

"Electronic Circuits-Preserving Technique for Decapsulating Plastic Packages," *IBM Technical Disclosure Bulletin*, vol. 30, No. 6, Nov. 1987, pp. 446 and 447.

*Primary Examiner*—William A. Powell
*Attorney, Agent, or Firm*—Calfee, Halter & Griswold

[57] ABSTRACT

A method and apparatus for selectively spray etching an epoxy encapsulated chip which is mounted to a chip carrier without damage to the chip, the chip carrier or other closely mounted chips. The apparatus includes a diaphragm which can be raised and lowered to direct the flow of etchant solution at the encapsulating material located alongside and under the chip. The encapsulating material is removed from the chip without removing the chip from the chip carrier.

13 Claims, 4 Drawing Sheets

APPARATUS AND METHOD FOR SELECTIVELY ETCHING A PLASTIC ENCAPSULATING MATERIAL

FIELD OF THE INVENTION

The present invention relates generally to the application of an etchant to a plastic encapsulating material, and more particularly to an apparatus and method for selectively spray etching an epoxy encapsulated chip which is mounted to a chip carrier without damage to the chip, the chip carrier or other closely mounted chips.

BACKGROUND OF THE INVENTION

Because of their low cost and ease of use, plastic materials, such as epoxy resins, are increasingly employed for encapsulating electronic devices. The encapsulating material may be used, for example, to reinforce the solder interconnections of a chip to a ceramic substrate. It is often necessary, however, to remove the epoxy encapsulant to inspect, test or repair the electronic device. In the prior art, various methods and apparatuses are employed for decapsulation of electronic devices.

U.S. Pat. No. 3,969,813 discloses a process and apparatus for removing encapsulant from about a semiconductor chip using a jet nozzle with a plurality (e.g. four) of precisely directed sprays which strike the encapsulant to effect removal of the chip. The chips being removed are mounted on a ceramic substrate.

U.S. Pat. No. 4,359,360 discloses an apparatus for jet etching a plastic encapsulant. The apparatus employs turbulent flow of the etchant, causing great agitation of the etchant to remove the encapsulant. The flow of the etchant is controlled by means of a vacuum source.

U.S. Pat. No. 4,384,917 discloses an apparatus for jet etching an encapsulated electronic device. The apparatus uses a partial vacuum to control the flow of the etchant. The entire electronic component to be decapsulated is exposed to the etchant.

Most of the conventional methods for decapsulating plastic packages, such as the jet etch method, require the use of chemical, plastic etching agents. The most common etching agents include hot concentrated acids such as nitric acid and sulfuric acid. The jet etch method requires the use of large quantities of concentrated acid. In addition, the concentrated acid must be used at a high temperature. As a result, conventional jet etch methods are costly, as well as potentially hazardous to personnel.

It is, therefore, an object of the present invention to selectively remove plastic encapsulant from about and under an electronic component which is adhered to a carrier without damage to the carrier and without the use of large quantities of chemical etchants.

SUMMARY OF THE INVENTION

The present invention relates to an apparatus for selectively etching a material which is encapsulating an electronic device, comprising: (a) a source of etchant solution; (b) a member which directs the flow of etchant solution from the source to a preselected portion of the encapsulating material; (c) means for variably positioning the member in relation to the electronic device; and (d) means for removing the etchant solution after it has contacted the encapsulating material.

The present invention further relates to a method of selectively etching a material which is encapsulating an electronic device having top and bottom surfaces and wherein the electronic device is attached to a substrate, comprising: (a) positioning a shielding fixture over the top surface of the electronic device; (b) directing a flow of etchant solution at the encapsulating material located alongside the electronic device to remove the encapsulation material; (c) lowering the shielding fixture to engage the top surface of the substrate subsequent to the removal of the encapsulating material located alongside the electronic device; (d) directing the flow of etchant solution at the encapsulating material located under the bottom surface of the electronic device to remove the encapsulating material; and (e) continuously removing the used etchant solution and removed encapsulating material from the area around the electronic device.

DETAILED DESCRIPTION OF THE INVENTION

Figure 1:
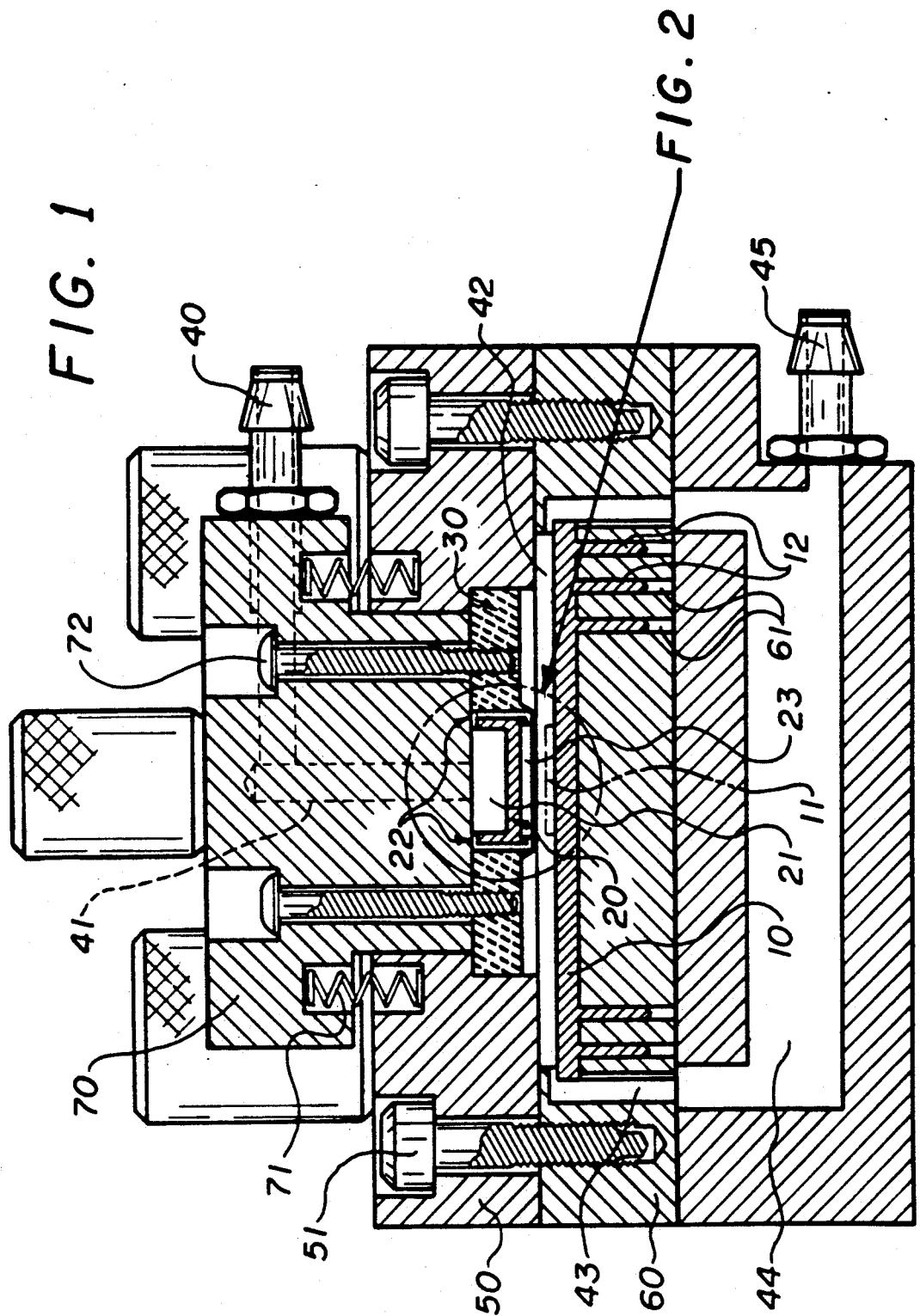
FIG. 1 is a cross-sectional schematic view of the apparatus of the present invention in the raised position.

The apparatus and method of the present invention will be described by reference to the drawings. FIG. 1 shows a cross-section of the apparatus for selectively etching an encapsulated electronic device. The electronic device includes a substrate 10, onto which is attached an integrated circuit assembly chip 11. For the purpose of describing the apparatus, substrate is shown with only one chip mounted thereto. However, a plurality of chips may be mounted to the substrate.

Substrate 10 is positioned in lower plate 60, so that the substrate pins 12 engage apertures 61. Lower plate 60 is secured to upper plate 50 by fasteners 51, which allow the upper plate 50 to be removed for installing the electronic device to be selectively etched. Upper plate 50 and lower plate 60 are constructed of a chemically inert material such as Teflon ™.

Figure 4A:
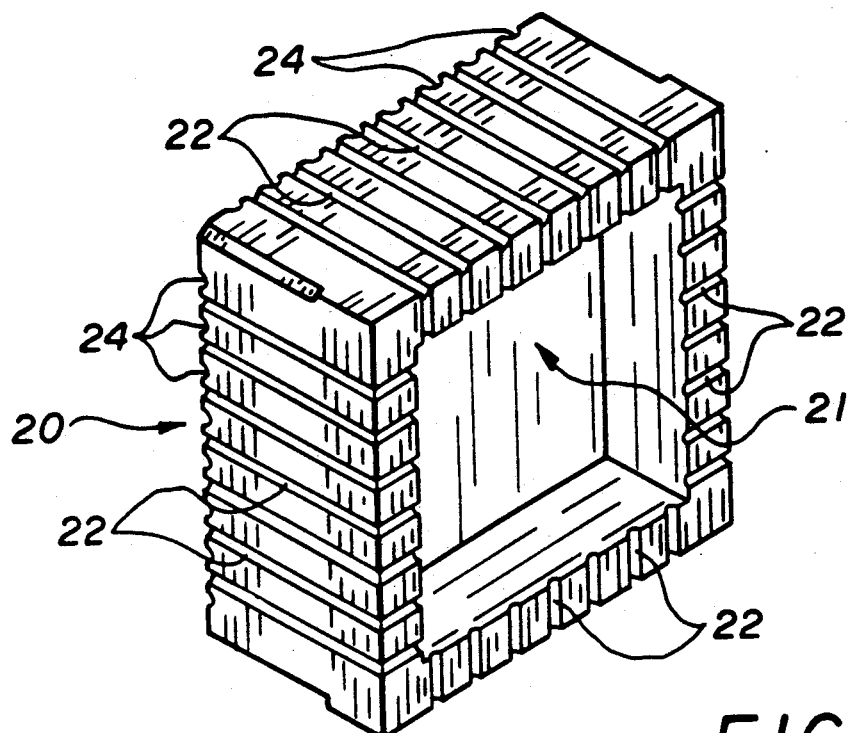
FIG. 4a and 4b are schematic views of the top and bottom, respectively, of the diaphragm of the present invention.
Figure 4B:
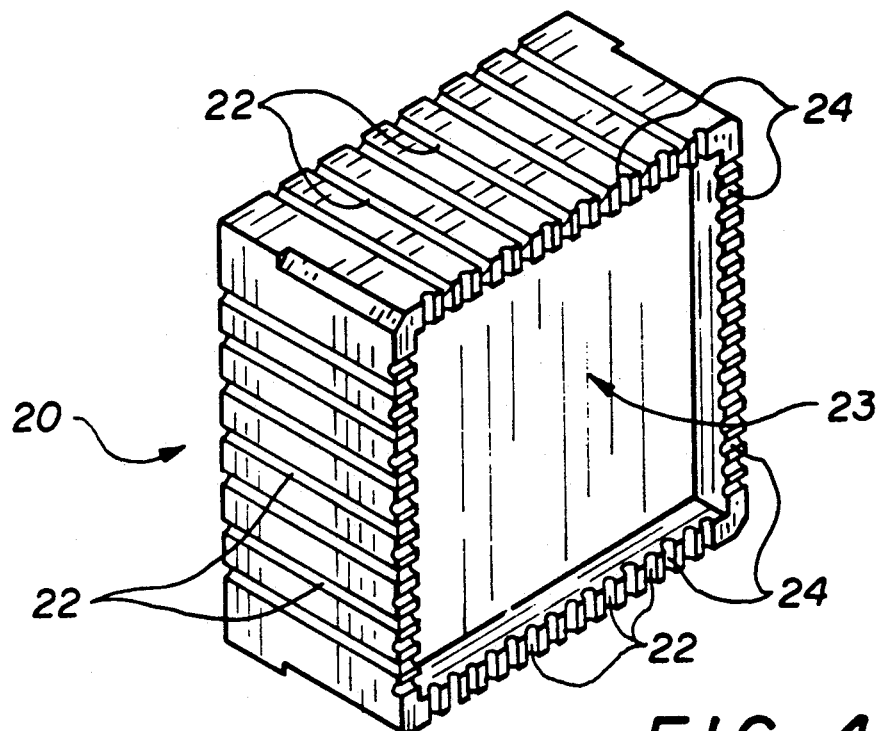
Figure 5:
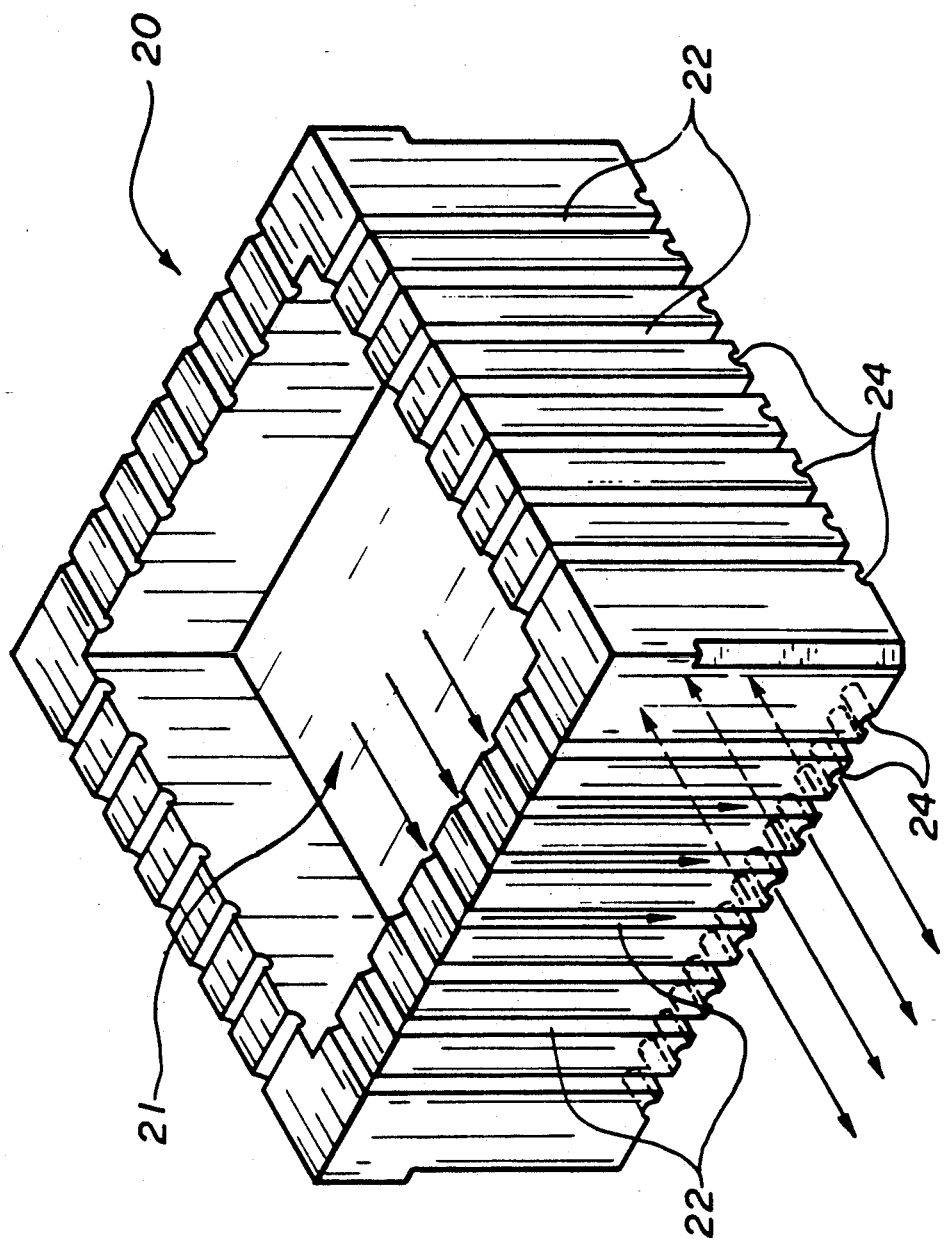
FIG. 5 is a drawing of the diaphragm of the present invention showing the flow of the etchant solution.

The etchant solution enters the apparatus at fluid inlet 40 at a flow rate of approximately 400 ml/min, flows through fluid conduit 41 to fluid receptacle 21. The etchant solution then flows through the fluid channels 22, located on each side of diaphragm 20 as shown in FIGS. 4a and 4b, and is directed at the portion of the encapsulating material surrounding the chip 11 to be etched. FIG. 5 shows the direction of the flow of etchant solution from fluid receptacle 21 into fluid channels 22. Diaphragm 20 acts to shield the top of chip 11 from the flow of etchant solution, thus helping to protect chip 11 from either chemical or physical damage caused by the etchant solution. The pressure of the incoming etchant solution is about 1–10 psi, and preferably about 5 psi. The used etchant solution along with dissolved encapsulating material flows from the chamber 42, located between the substrate 10 and the diaphragm holder 30, through the fluid discharge 43, and into the fluid collection chamber 44. The used etchant solution is drawn out of the apparatus at fluid outlet 45 by a vacuum source. The used etchant solution is collected and recycled through the apparatus, thus reducing the amount of etchant solution required.

Figure 2:
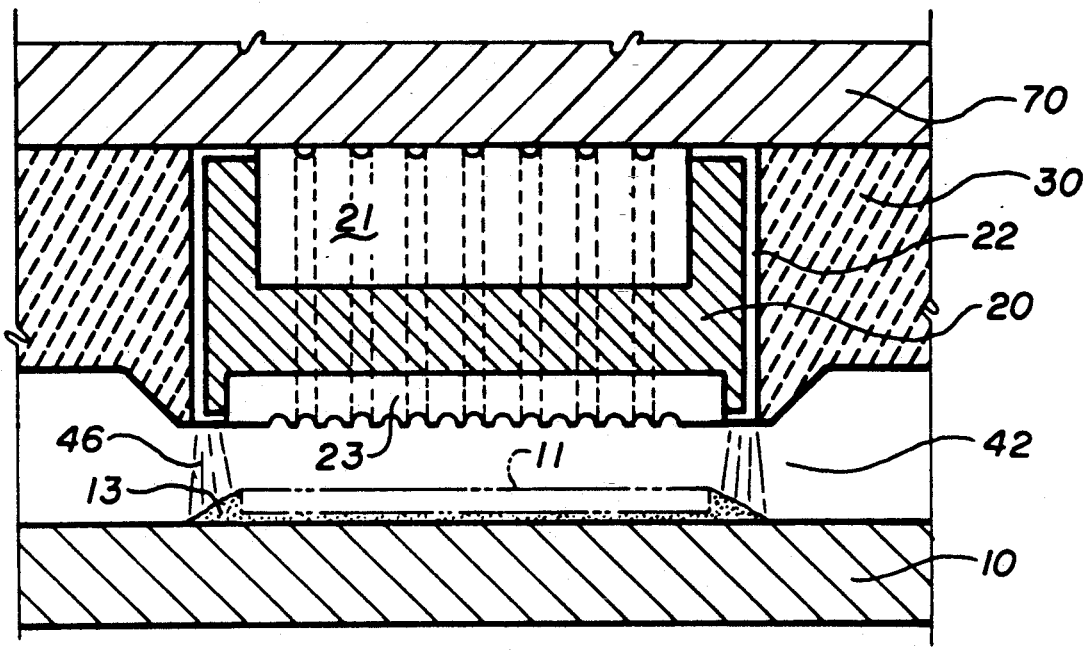
FIG. 2 is an enlarged partial view of the indicated circular region of FIG. 1.
Figure 3:
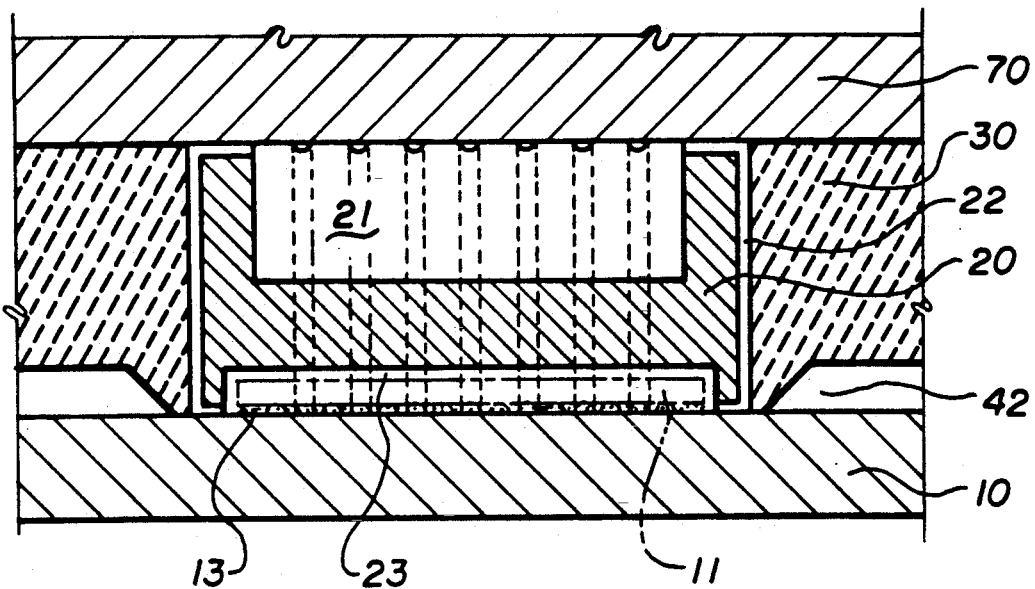
FIG. 3 is an enlarged partial view of the indicated circular region of FIG. 1 wherein the apparatus of the present invention is in the lowered position.

Movable housing 70, which includes diaphragm 20 and diaphragm holder 30, is positioned in the raised position so that a spray of etchant solution 46 is directed at the encapsulant 13 along the sides of chip 11 as shown in FIG. 2. Diaphragm 20 is constructed of stainless steel. Diaphragm holder 30 is constructed of Teflon. Diaphragm 20 is press-fit into diaphragm holder 30. Fluid channels 22 are small, approximately 5 mil. diameter channels which are wire cut into the outer side surfaces of diaphragm 20. Exit channels 24, are approximately 6 mil diameter channels wire cut into the bottom edge surface of diaphragm 20. Once the encapsulant 13 located at the sides of chip 11 is removed, diaphragm 20 and diaphragm holder 30 can be lowered (as shown in FIG. 3) so that the bottom surface of diaphragm 20 is in contact with the upper surface of substrate 10. The position of movable housing 70 can be changed from the raised position to the lowered position by tightening screws 72. In the lowered position, springs 71 are compressed.

FIG. 3 shows the diaphragm 20 in the lowered position. In this position, diaphragm 20 is lowered to enclose chip 11 and make contact to substrate 10. The diaphragm cavity 23 fits over chip 11. As a result of the change in position, the etchant solution flows from fluid receptacle 21 into fluid channels 22, and is diverted into diaphragm cavity 23. The etchant solution is directed under chip 11 to etch the encapsulating material located between the bottom surface of chip 11 and the top surface of substrate 10. The used etchant solution exits diaphragm cavity 23 through exit channels 24 as shown in FIG. 5. FIG. 4 shows the position of diaphragm 20 in relation to chip 11 and substrate 10.

EXAMPLE

A ceramic substrate having a chip attached thereto and an epoxy encapsulant surrounding the chip is installed inside the apparatus of the present invention. The encapsulant is a cleavable diepoxide as disclosed in co-pending application Ser. No. 755,253, filed Sep. 5, 1991. entitled "Cleavable Diepoxide for Removable Device Protection in Electronic Packaging". The etching fluid is a heated mixture of ethanol and methanesulfonic acid. The diaphragm is first positioned in the raised position so that the flow of ethanol/methanesulfonic acid is directed at the epoxy alongside the chip, rather than deflected off of the surface of the chip. The pressure of the flow of etching spray is about 5 psi. Once the epoxy alongside the chip has been removed, the diaphragm is lowered so that the flow of ethanol/methanesulfonic acid is directed at the epoxy located in the 3 mil space between the underside of the chip and the top surface of the ceramic substrate. The encapsulant about and under the chip is removed without removing the chip from the substrate. The chip may be subsequently removed by a known process.

The apparatus of the present invention may also be used for water rinsing under and alongside the chip, or for directing any other fluid under and alongside the attached chip.

The invention is not limited to the embodiment of the apparatus and method which has just been described and it is intended by the following claims to include all technically equivalent means which come within the full scope and true spirit of the invention.

We claim:

1. An apparatus for selectively etching a material which is encapsulating an electronic device, comprising:
   a. a source of etchant solution;
   b. a member which directs the flow of etchant solution from said source to a preselected portion of said encapsulating material;
   c. a movable housing for variably positioning said member in relation to the electronic device; and
   d. a removal assembly for removing the etchant solution after it has contacted the encapsulating material.

2. The apparatus of claim 1 wherein said member has an outer surface defining a plurality of channels.

3. The apparatus of claim wherein said member includes a bottom cavity which fits over the electronic device.

4. The apparatus of claim 1 wherein said movable housing comprises means for positioning said member in a raised position and a lowered position relative to the electronic device.

5. The apparatus of claim 4 wherein said member in its raised position directs the flow of etchant solution at the portion of encapsulating material located alongside the electronic device.

6. The apparatus of claim 4 wherein said member in its lowered position directs the flow of etchant solution at the portion of encapsulating material located under the electronic 7. The apparatus of claim 1 wherein said removal assembly comprises a collection chamber in connection with a 8. The apparatus of claim 1 further comprising means for rinsing the electronic device.

9. An apparatus for selectively etching a material which is encapsulating an electronic device having top and bottom surfaces and wherein the electronic device is attached to a substrate, comprising:
   a. means for positioning a shielding fixture over the top surface of the electronic device;
   b. means for directing a flow of etchant solution at the encapsulating material located alongside the electronic device to remove said encapsulation material;
   c. means for lowering said shielding fixture to engage the top surface of said substrate subsequent to the removal of said encapsulating material located alongside the electronic device;
   d. means for directing said flow of etchant solution at the encapsulating material located under the bottom surface of the electronic device to remove said encapsulating material; and
   e. means for continuously removing the etchant solution and removed encapsulating material from the area around the electronic device.

10. A method of selectively etching a material which is encapsulating an electronic device having top and bottom surfaces and wherein the electronic device is attached to a substrate, comprising:
   a. positioning a shielding fixture over the top surface of the electronic device;
   b. directing a flow of etchant solution at the encapsulating material located alongside the electronic device to remove said encapsulation material;

c. lowering said shielding fixture to engage the top surface of said substrate subsequent to the removal of said encapsulating material located alongside the electronic device;

d. directing said flow of etchant solution at the encapsulating material located under the bottom surface of the electronic device to remove said encapsulating material; and e. continuously removing the used etchant solution and removed encapsulating material from the area around the electronic device.

11. The method of claim 10 wherein said encapsulating material comprises an epoxy.

12. The method of claim 10 further comprising directing a flow of rinsing solution at the areas alongside and under the bottom surface of the electronic device.

13. The method of claim 10 wherein the pressure of said flow of etchant solution is about 1-10 psi.

* * * * *

UNITED STATES PATENT AND TRADEMARK OFFICE
CERTIFICATE OF CORRECTION

PATENT NO. : 5,252,179
DATED : October 12, 1993
INVENTOR(S) : Ellerson, et al.

It is certified that error appears in the above-identified patent and that said Letters Patent is hereby corrected as shown below:

In the Claims:

Col. 4, line 18, after "claim" insert --1--.

Col. 4, line 32, after "electronic" insert --device.--

Col. 4, line 35, after "with a" insert --vacuum source.--

Col. 4, line 56, after "removing the" insert --used--

Signed and Sealed this

Twenty-second Day of March, 1994

*Attest:*

BRUCE LEHMAN

*Attesting Officer*   *Commissioner of Patents and Trademarks*